US012648371B2

(12) United States Patent
Chung et al.

(10) Patent No.: US 12,648,371 B2
(45) Date of Patent: Jun. 2, 2026

(54) VARIABLE RESISTANCE MATERIAL AND VARIABLE RESISTANCE MEMORY DEVICE INCLUDING THE SAME

(71) Applicant: SAMSUNG ELECTRONICS CO., LTD., Suwon-si (KR)

(72) Inventors: Sukhwan Chung, Suwon-si (KR); Zhe Wu, Suwon-si (KR); Jung Moo Lee, Suwon-si (KR); Hideki Horii, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 18/236,651

(22) Filed: Aug. 22, 2023

(65) Prior Publication Data

US 2024/0237564 A1    Jul. 11, 2024

(30) Foreign Application Priority Data

Jan. 6, 2023    (KR) ........................ 10-2023-0002198

(51) Int. Cl.
| | |
|---|---|
| *H10N 70/00* | (2023.01) |
| *C22C 30/00* | (2006.01) |
| *H10B 63/00* | (2023.01) |
| *H10B 63/10* | (2023.01) |
| *H10N 70/20* | (2023.01) |

(52) U.S. Cl.
CPC ......... *H10N 70/8828* (2023.02); *C22C 30/00* (2013.01); *H10B 63/10* (2023.02); *H10B 63/24* (2023.02); *H10N 70/231* (2023.02)

(58) Field of Classification Search
CPC ........ H10B 63/10; H10B 63/20; H10B 63/24; H10B 63/80; H10N 70/231; H10N 70/8828; C22C 30/00
See application file for complete search history.

(56) References Cited

U.S. PATENT DOCUMENTS

| | | | |
|---|---|---|---|
| 8,237,140 B2 | 8/2012 | Lung et al. | |
| 8,614,499 B2 * | 12/2013 | Smythe .............. | H10N 70/8825 |
| | | | 257/536 |
| 8,680,499 B2 | 3/2014 | Erbetta et al. | |
| 8,946,666 B2 | 2/2015 | Cheng et al. | |
| 9,012,876 B2 | 4/2015 | Zheng | |
| 9,214,229 B2 * | 12/2015 | Cheng ................. | H10N 70/026 |
| 9,614,152 B2 * | 4/2017 | Kim ....................... | H10B 63/80 |
| 11,362,276 B2 | 6/2022 | Cheng et al. | |
| 2016/0181521 A1 * | 6/2016 | Kim ................... | H10N 70/8413 |
| | | | 257/4 |
| 2017/0250222 A1 * | 8/2017 | Wu ........................ | H10B 63/20 |
| 2021/0249594 A1 | 8/2021 | Cappelletti et al. | |

* cited by examiner

*Primary Examiner* — Matthew E Warren
(74) *Attorney, Agent, or Firm* — Muir Patent Law, PLLC

(57) ABSTRACT

A variable resistance memory device includes a first electrode; a variable resistance material on the first electrode; and a second electrode on the variable resistance material, wherein the variable resistance material includes an impurity (A) and is represented as $A_pGe_xSb_yTe_z$, an atomic concentration 'x' of the germanium is $0.4 \leq x \leq 0.5$, an atomic concentration 'z' of the tellurium is $0.3 \leq z < 0.6$, an atomic concentration 'p' of the impurity is $0 < p \leq 0.1$, and an atomic concentration 'y' of the antimony is $1-x-z-p$ and is greater than 0.

20 Claims, 7 Drawing Sheets

100

MC

MC11   MC12   MC13

WL1

WL    MC21   MC22   MC23

WL2

MC31   MC32   MC33

WL3

BL1    BL2    BL3

BL

VARIABLE RESISTANCE MATERIAL AND VARIABLE RESISTANCE MEMORY DEVICE INCLUDING THE SAME

CROSS-REFERENCE TO RELATED APPLICATIONS

This U.S. non-provisional patent application claims priority under 35 U.S.C. § 119 to Korean Patent Application No. 10-2023-0002198, filed on Jan. 6, 2023, in the Korean Intellectual Property Office, the entire contents of which are hereby incorporated by reference.

BACKGROUND

1. Field

Embodiments relate to a variable resistance material and a variable resistance memory device including the same.

2. Description of the Related Art

Semiconductor memory devices may be classified into volatile memory devices and non-volatile memory devices. The volatile memory devices may lose their stored data when their power supplies are interrupted, and the volatile memory devices may include, e.g., dynamic random access memory (DRAM) devices and static random access memory (SRAM) devices. On the contrary, the non-volatile memory devices may retain their stored data even when their power supplies are interrupted, and the non-volatile memory devices may include, e.g., programmable ROM (PROM), erasable PROM (EPROM), electrically EPROM (EE-PROM), and a flash memory device.

In addition, next-generation semiconductor memory devices (e.g., magnetic random access memory (MRAM) devices and phase-change random access memory (PRAM) devices) have been developed to provide high-performance and low power consumption semiconductor memory devices. Materials of these next-generation semiconductor memory devices may have resistance values that vary according to currents or voltages applied thereto and may retain their resistance values even when currents or voltages are interrupted.

SUMMARY

The embodiments may be realized by providing a variable resistance memory device including a first electrode; a variable resistance material on the first electrode; and a second electrode on the variable resistance material, wherein the variable resistance material includes germanium (Ge), antimony (Sb), tellurium (Te), and at least one impurity (A) and is represented as $A_pGe_xSb_yTe_z$, an atomic concentration 'x' of the germanium is $0.4 \leq x \leq 0.5$, an atomic concentration 'z' of the tellurium is $0.3 \leq z < 0.6$, an atomic concentration 'p' of the impurity is $0 < p \leq 0.1$, and an atomic concentration 'y' of the antimony is $1-x-z-p$ and is greater than 0.

The embodiments may be realized by providing a variable resistance material, wherein the variable resistance material includes germanium (Ge), antimony (Sb), tellurium (Te), and at least one impurity (A) and is represented as $A_pGe_xSb_yTe_z$, wherein an atomic concentration 'x' of germanium is $0.4 \leq x \leq 0.5$, an atomic concentration 'z' of tellurium is $0.3 \leq z < 0.6$, an atomic concentration 'p' of an impurity (A) is $0 < p \leq 0.1$, and an atomic concentration 'y' of antimony is $1-x-z-p$ and is greater than 0.

BRIEF DESCRIPTION OF THE DRAWINGS

Features will be apparent to those of skill in the art by describing in detail exemplary embodiments with reference to the attached drawings in which.

DETAILED DESCRIPTION

The term 'atomic concentration' used herein may be defined as a value obtained by dividing the number of specific atoms included in a variable resistance material by a number of total atoms of the variable resistance material. In an implementation, in a case in which the variable resistance material includes $Ge_4Sb_2Te_3$, an atomic concentration of germanium (Ge) may be 4/9, an atomic concentration of antimony (Sb) may be 2/9, and an atomic concentration of tellurium (Te) may be 3/9.

Figures 1, 2:
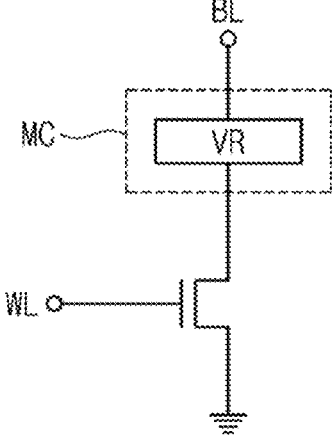
FIG. 1 is a circuit diagram illustrating a memory cell array of a variable resistance memory device according to some embodiments.
FIG. 2 is a circuit diagram illustrating one of memory cells of FIG. 1.

FIG. 1 is a circuit diagram illustrating a memory cell array of a variable resistance memory device according to some embodiments. FIG. 2 is a circuit diagram illustrating one of memory cells of FIG. 1.

Referring to FIGS. 1 and 2, a variable resistance memory device may include a variable resistance memory cell array 100. The variable resistance memory cell array 100 may include a plurality of variable resistance memory cells MC. In an implementation, the variable resistance memory cell array 100 may include nine variable resistance memory cells MC11 to MC33 arranged in a 3×3 matrix form. In an implementation, the number and arrangement of the variable resistance memory cells MC may be variously changed.

The variable resistance memory cell array 100 may include a plurality of word lines WL and a plurality of bit lines BL. In an implementation, the plurality of word lines WL may include first to third word lines WL1, WL2 and WL3. In an implementation, the plurality of bit lines BL may include first to third bit lines BL1, BL2 and BL3. Each of the variable resistance memory cells MC may be connected to a corresponding word line WL and a corresponding bit line BL. In an implementation, one variable resistance memory cell MC22 may be connected to the second word line WL2 and the second bit line BL2.

Each of the variable resistance memory cells MC may include a variable resistance material VR. In an implementation, the variable resistance material VR may be a phase-change material (PCM). The phase-change material may be in a crystalline state or an amorphous state. In an implementation, the phase-change material in the crystalline state may have a threshold voltage lower than that of the phase-change material in the amorphous state.

In an implementation, the phase-change material in the amorphous state may have a high resistance state (HRS). A phase-change memory cell may have data of '0' when the phase-change material has the high resistance state. On the other hand, the phase-change material in the crystalline state may have a low resistance state (LRS). The phase-change memory cell may have data of '1' when the phase-change material has the low resistance state. A reset operation may be defined as an operation of allowing the phase-change memory cell to have the data of '0' (i.e., an operation of allowing the phase-change material to have the amorphous state). A set operation may be defined as an operation of allowing the phase-change memory cell to have the data of '1' (i.e., an operation of allowing the phase-change material to have the crystalline state).

The variable resistance material VR according to an embodiment may include, e.g., germanium (Ge), antimony (Sb), tellurium (Te), and an impurity (A). In an implementation, the variable resistance material VR may be represented as $A_pGe_xSb_yTe_z$ (herein, $A_pGe_xSb_yTe_z$ is merely to show atomic ratios of the elements, and is not intended to illustrate the actual structure of the variable resistance material VR). In an implementation, 'x' is an atomic concentration of germanium (Ge). 'y' is an atomic concentration of antimony (Sb). 'z' is an atomic concentration of tellurium (Te). 'p' is an atomic concentration of the impurity (A). A sum of the atomic concentrations of germanium (Ge), antimony (Sb), tellurium (Te) and the impurity (A) is 1. In an implementation, a sum of 'x', 'y', 'z' and 'p' is 1. In an implementation, the variable resistance material VR may be a single layer or a composite layer. In an implementation, the impurity (A) may include, e.g., B, C, N, or O. As used herein, the term "or" is not an exclusive term, e.g., "A or B" would include A, B, or A and B.

Figure 3:
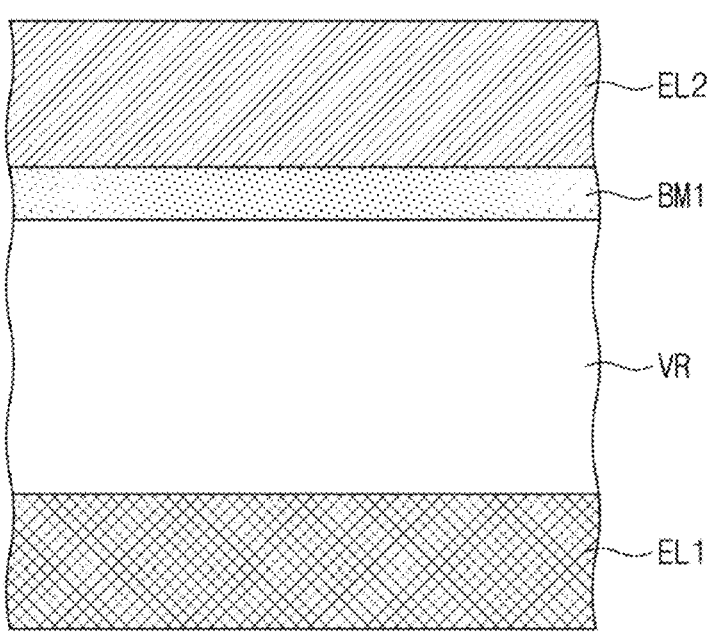
FIG. 3 is a cross-sectional view illustrating a memory cell of a variable resistance memory device according to some embodiments.

FIG. 3 is a cross-sectional view illustrating a memory cell of a variable resistance memory device according to some embodiments.

Referring to FIG. 3, a variable resistance memory device may include, e.g., a first electrode EL1, a variable resistance material VR, a first barrier pattern BM1, and a second electrode EL2.

Each of the first electrode EL1 and the second electrode EL2 may include a conductive material. In an implementation, the first electrode EL1 and the second electrode EL2 may include the same material. In an implementation, the first electrode EL1 and the second electrode EL2 may include different materials. In an implementation, each of the first electrode EL1 and the second electrode EL2 may include carbon. In an implementation, each of the first electrode EL1 and the second electrode EL2 may include a metal (e.g., a non-compounded metal) or a metal nitride. In an implementation, the first electrode EL1 may include, e.g., TiN.

In an implementation, the first electrode EL1 may be controlled by the word line WL of FIG. 2, and the second electrode EL2 may be connected to the bit line BL of FIG.

2. In an implementation, the first electrode EL1 may be located on a source line contact portion. In an implementation, the second electrode EL2 may be on the bit line BL. In an implementation, the second electrode EL2 may connect the first barrier pattern BM1 to the bit line BL of FIG. 2.

In an implementation, the variable resistance material VR may be on the first electrode EL1. In an implementation, the variable resistance material VR may be between the first electrode EL1 and the second electrode EL2.

The first barrier pattern BM1 may include a metal or a metal nitride. In an implementation, the first barrier pattern BM1 may include, e.g., W, Ti, Al, Cu, C, CN, TiN, TiAlN, TiSiN, TiCN, WN, CoSiN, WSiN, TaN, TaCN, or TaSiN. In an implementation, the first barrier pattern BM1 may be on the variable resistance material VR. In an implementation, the first barrier pattern BM1 may be between the variable resistance material VR and the second electrode EL2. The first barrier pattern BM1 may help reduce or prevent diffusion of the material of the variable resistance material VR.

Figure 4:
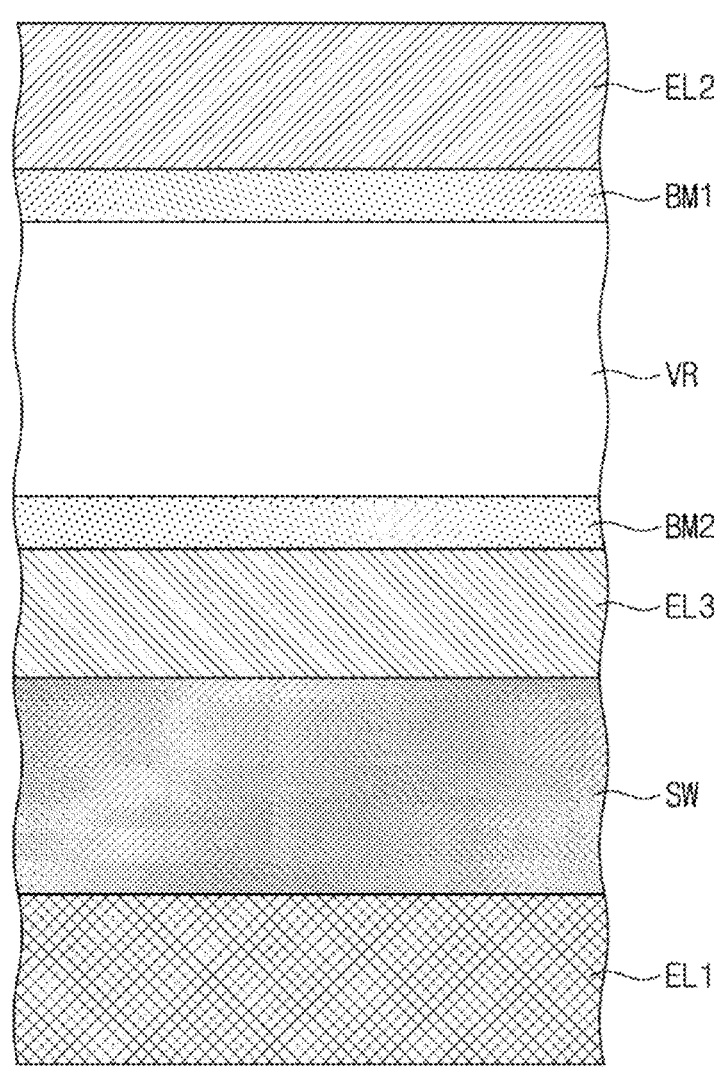
FIG. 4 is a cross-sectional view illustrating a memory cell of a variable resistance memory device according to some embodiments.

FIG. 4 is a cross-sectional view illustrating a memory cell of a variable resistance memory device according to some embodiments.

Referring to FIG. 4, a variable resistance memory device may include, e.g., a first electrode EL1, a selection element SW, a third electrode EL3, a second barrier pattern BM2, a variable resistance material VR, a first barrier pattern BM1, and a second electrode EL2. Hereinafter, the descriptions to the same features as mentioned above may be omitted and differences between the present embodiments and the above embodiments will be mainly described, for the purpose of ease and convenience in explanation.

Each of the first electrode EL1, the second electrode EL2 and the third electrode EL3 may include a conductive material. In an implementation, the first electrode EL1, the second electrode EL2 and the third electrode EL3 may include the same material. In an implementation, the first electrode EL1, the second electrode EL2 and the third electrode EL3 may include different materials. In an implementation, each of the first electrode EL1, the second electrode EL2 and the third electrode EL3 may include carbon. In an implementation, each of the first electrode EL1, the second electrode EL2 and the third electrode EL3 may include a metal or a metal nitride.

In an implementation, the first electrode EL1 may be controlled by the word line WL of FIG. 2. In an implementation, the second electrode EL2 may be connected to the bit line BL of FIG. 2. In an implementation, the second electrode EL2 may connect the first barrier pattern BM1 to the bit line BL of FIG. 2.

In an implementation, the third electrode EL3 may be controlled by the selection element SW. In an implementation, the third electrode EL3 may be on the selection element SW. In an implementation, the third electrode EL3 may be between the second barrier pattern BM2 and the selection element SW.

The selection element SW may be a diode or may be an element based on a threshold switching phenomenon having a nonlinear I-V curve (e.g., a S-shaped I-V curve). In an implementation, the selection element SW may be an ovonic threshold switch (OTS) element having bi-directional properties. In an implementation, the ovonic threshold switch element may have a phase transition temperature between crystalline and amorphous phases, which is higher than that of the variable resistance material VR. In an implementation, the phase transition temperature of the ovonic threshold switch element may range from about 350° C. to about 450° C.

In an implementation, the ovonic threshold switch element may include GeSe, GeS, AsSe, AsTe, AsS SiTe, SiSe, SiS, GeAs, SiAs, SnSe, or SnTe. In an implementation, the ovonic threshold switch element may include GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe. In an implementation, the ovonic threshold switch element may include GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn. In an implementation, the ovonic threshold switch element may include GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeالسTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn. In an implementation, the ovonic threshold switch element may include GeSiAsSeTeS, GeSiAsSeTeIn, GeSiAsSeTeGa, GeSiAsSeTeAl, GeSiAsSeTeTi, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTi, GeSiAsSeInZn, GeSiAsSeInSn, GeSiAsSeGaAl, GeSiAsSeGaTi, GeSiAsSeGaZn, GeSiAsSeGaSn, GeSiAsSeAlSn, GeAsSeTeInGa, GeAsSeTeInAl, GeAsSeTeInTi, GeAsSeTeInZn, GeAsSeTeInSn, GeAsSeTeGaAl, GeAsSeTeGaTi, GeAsSeTeGaZn, GeAsSeTeGaSn, GeAsSeTeAlSn, GeAsSeSInGa, GeAsSeSInAl, GeAsSeSInTi, GeAsSeSInZn, GeAsSeSInSn, GeAsSeSGaAl, GeAsSeSGaTi, GeAsSeSGaZn, GeAsSeSGaSn, or GeAsSeSAlSn.

In an implementation, the selection element SW may be on the first electrode EL1. In an implementation, the selection element SW may be between the first electrode EL1 and the third electrode EL3.

Each of the first and second barrier patterns BM1 and BM2 may include a metal or a metal nitride. In an implementation, each of the first and second barrier patterns BM1 and BM2 may include W, Ti, Al, Cu, C, CN, TiN, TiAlN, TiSiN, TiCN, WN, CoSiN, WSiN, TaN, TaCN, or TaSiN. In an implementation, the first barrier pattern BM1 may be on a top surface of the variable resistance material VR. In an implementation, the second barrier pattern BM2 may be on a bottom surface of the variable resistance material VR. Each of the first and second barrier patterns BM1 and BM2 may help reduce or prevent diffusion of the material of the variable resistance material VR. In an implementation, the first barrier pattern BM1 may help reduce or prevent the material of the variable resistance material VR from being diffused into the second electrode EL2. In an implementation, the second barrier pattern BM2 may help reduce or prevent the material of the variable resistance material VR from being diffused into the third electrode EL3.

In an implementation, the variable resistance material VR may be on the third electrode EL3. In an implementation, the variable resistance material VR may be between the third electrode EL3 and the second electrode EL2. In an implementation, the variable resistance material VR may be on the second barrier pattern BM2. In an implementation, the variable resistance material VR may be between the second barrier pattern BM2 and the first barrier pattern BM1.

Figure 5:
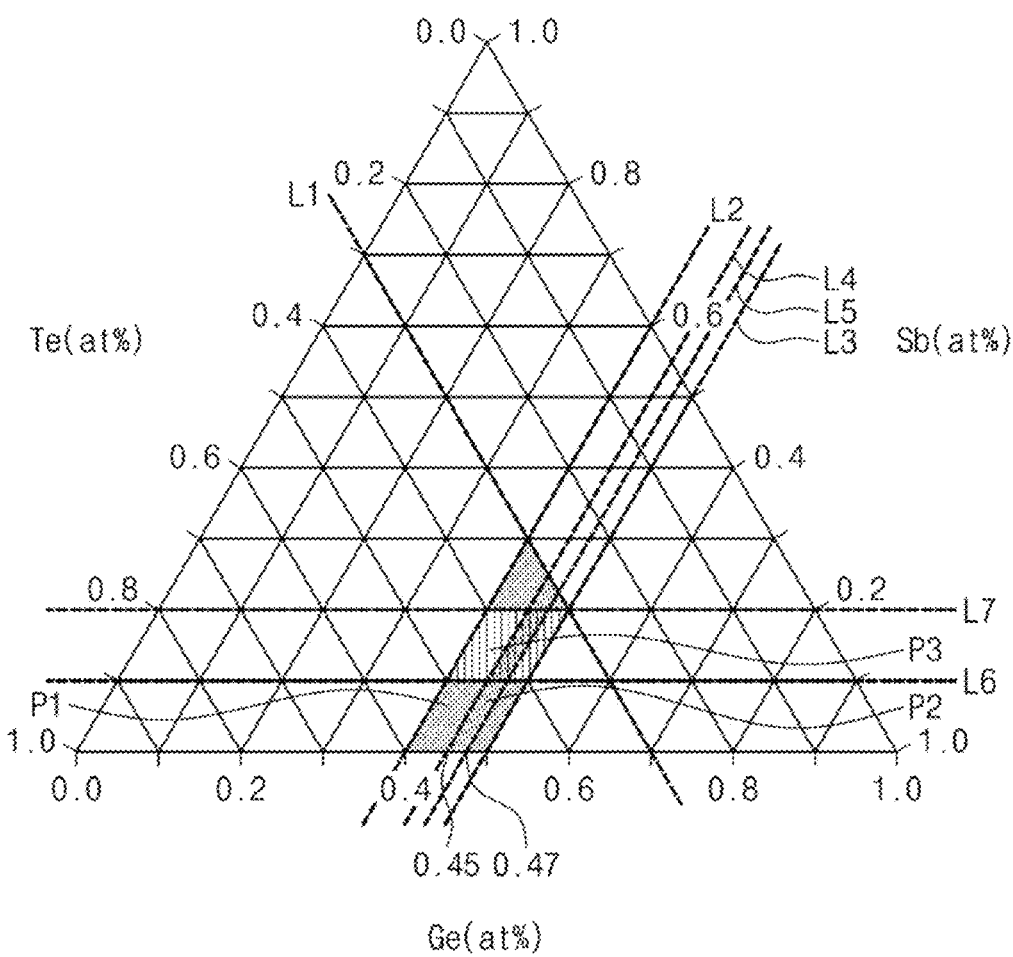
FIG. 5 is a ternary phase diagram of Ge—Sb—Te included in a variable resistance material.

FIG. 5 is a ternary phase diagram of Ge—Sb—Te included in a variable resistance material. Hereinafter, various compositions of a variable resistance material VR according to some embodiment will be described with reference to FIG. 5.

Referring to FIG. 5, a variable resistance material VR according to an embodiment may include germanium (Ge), antimony (Sb), and tellurium (Te) (e.g., and an impurity). In an implementation, the variable resistance material VR may be the variable resistance material VR described with reference to FIG. 3 or 4. Hereinafter, composition ratios of germanium (Ge), antimony (Sb) and tellurium (Te) of the variable resistance material VR will be described using a plurality of composition lines L1, L2, L3, L4, L5, L6 and L7 in the ternary phase diagram.

A first composition line L1 is a line connecting composition points at which the atomic concentration 'z' of tellurium (Te) is 0.3. A second composition line L2 is a line connecting composition points at which the atomic concentration 'x' of germanium (Ge) is 0.4. A third composition line L3 is a line connecting composition points at which the atomic concentration 'x' of germanium (Ge) is 0.5. A fourth composition line L4 is a line connecting composition points at which the atomic concentration 'x' of germanium (Ge) is 0.45. A fifth composition line L5 is a line connecting composition points at which the atomic concentration 'x' of germanium (Ge) is 0.47. A sixth composition line L6 is a line connecting composition points at which the atomic concentration 'y' of antimony (Sb) is 0.1. A seventh composition line L7 is a line connecting composition points at which the atomic concentration 'y' of antimony (Sb) is 0.2. The compositions according to various embodiments may be defined in a region surrounded by the plurality of composition lines.

In an implementation, a composition ratio of germanium (Ge), antimony (Sb) and tellurium (Te) of the variable resistance material VR may be defined in a first composition region P1 surrounded by the first to third composition lines L1, L2 and L3. In the first composition region P1, the atomic concentration 'x' of germanium (Ge) may be $0.4 \leq x \leq 0.5$, the atomic concentration 'z' of tellurium (Te) may be $0.3 \leq z < 0.6$, and the atomic concentration 'y' of antimony (Sb) may be greater than 0 and may be defined as $1-x-z-p$. The impurity (A) may be added to or included in the variable resistance material VR having the composition ratio in the first composition region P1. The variable resistance material VR may be represented as $A_p Ge_x Sb_y Te_z$. In an implementation, an atomic concentration ratio or atomic ratio of germanium (Ge):antimony (Sb):tellurium (Te) may be 4:1:4. In an implementation, the atomic concentration ratio of germanium (Ge):antimony (Sb):tellurium (Te) may be 4:2:3. In an implementation, the impurity (A) may include, e.g., B, C, N, or O. In an implementation, the atomic concentration 'p' of the impurity (A) may be $0 < p \leq 0.1$. In an implementation, an atomic concentration of carbon (C) or nitrogen (N) may be greater than 0 and may be equal to or less than 0.1. In an implementation, the atomic concentration of carbon (C) or nitrogen (N) may be equal to or greater than 0.06 and may be equal to or less than 0.1. In an implementation, the variable resistance material VR may be a single layer or a composite layer. In an implementation, in the case in which the impurity (A) having the atomic concentration 'p' of $0<p\leq0.1$ is added to or included in the variable resistance material VR in the first composition region P1, a set speed of the variable resistance memory device including the variable resistance material VR may be, e.g., 400 ns or less.

In an implementation, the composition ratio of germanium (Ge), antimony (Sb) and tellurium (Te) of the variable resistance material VR may be defined in a second composition region P2 surrounded by the first, fourth and fifth composition lines L1, L4 and L5. In an implementation, the second composition region P2 may be included in the first composition region P1. In an implementation, in the second composition region P2, the atomic concentration 'x' of germanium (Ge) may be $0.45\leq x\leq0.47$, the atomic concentration 'z' of tellurium (Te) may be $0.3\leq z<0.55$, and the atomic concentration 'y' of antimony (Sb) may be greater than 0 and may be defined as $1-x-z-p$. The impurity (A) may be included the variable resistance material VR having the composition ratio in the second composition region P2. The variable resistance material VR may be represented as $A_pGe_xSb_yTe_z$. In an implementation, the impurity (A) may include B, C, N, or O. In an implementation, the atomic concentration 'p' of the impurity (A) may be $0<p\leq0.1$. In an implementation, the atomic concentration of carbon (C) or nitrogen (N) may be greater than 0 and may be equal to or less than 0.1. In an implementation, the atomic concentration of carbon (C) or nitrogen (N) may be equal to or greater than 0.06 and may be equal to or less than 0.1. In an implementation, the variable resistance material VR may be a single layer or a composite layer. In an implementation, in the case in which the impurity (A) having the atomic concentration 'p' of $0<p\leq0.1$ is included in the variable resistance material VR in the second composition region P2, a set speed of the variable resistance memory device including the variable resistance material VR may be 400 ns or less.

In an implementation, the composition ratio of germanium (Ge), antimony (Sb) and tellurium (Te) of the variable resistance material VR may be defined in a third composition region P3 surrounded by the second, third, sixth and seventh composition lines L2, L3, L6 and L7. In an implementation, the third composition region P3 may be included in the first composition region P1. In an implementation, in the third composition region P3, the atomic concentration 'x' of germanium (Ge) may be $0.4\leq x\leq0.5$, the atomic concentration 'z' of tellurium (Te) may be $0.3\leq z<0.5$, and the atomic concentration 'y' of antimony (Sb) may be $0.1\leq y\leq0.2$ and may be defined as $1-x-z-p$. The impurity (A) may be included in the variable resistance material VR having the composition ratio in the third composition region P3. The variable resistance material VR may be represented as $A_pGe_xSb_yTe_z$. In an implementation, the impurity (A) may include B, C, N, or O. In an implementation, the atomic concentration 'p' of the impurity (A) may be $0<p\leq0.1$. In an implementation, the atomic concentration of carbon (C) or nitrogen (N) may be greater than 0 and may be equal to or less than 0.1. In an implementation, the atomic concentration of carbon (C) or nitrogen (N) may be equal to or greater than 0.06 and may be equal to or less than 0.1. In an implementation, the variable resistance material VR may be a single layer or a composite layer. In an implementation, in the case in which the impurity (A) having the atomic concentration 'p' of $0<p\leq0.1$ is included in the variable resistance material VR in the third composition region P3, a set speed of the variable resistance memory device including the variable resistance material VR may be 400 ns or less.

Hereinafter, effects of the variable resistance material VR and the variable resistance memory device including the same in the embodiments will be described in more detail with reference to FIGS. 6 to 9.

Figure 6:
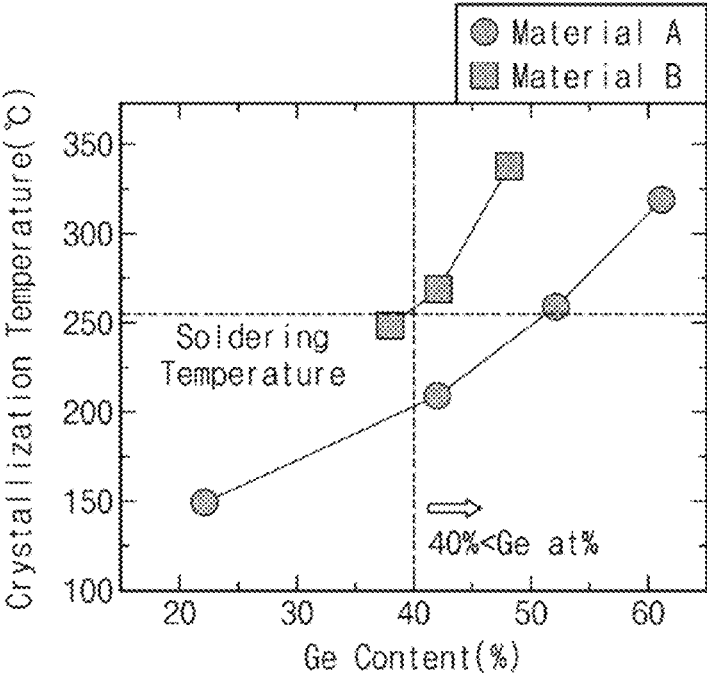
FIG. 6 is a graph showing a crystallization temperature of a variable resistance material according to an atomic concentration of germanium (Ge).

FIG. 6 is a graph showing a crystallization temperature of the variable resistance material VR according to an atomic concentration of germanium (Ge). Hereinafter, a minimum atomic concentration of germanium (Ge) in the variable resistance material VR with improved thermal stability and set operating characteristics will be described with reference to FIG. 6.

Referring to FIG. 6, a phase-change temperature of the variable resistance material VR may be increased as the atomic concentration of germanium (Ge) increases. In a case in which the atomic concentration of germanium (Ge) in the variable resistance material VR including the impurity is equal to the atomic concentration of germanium (Ge) in the variable resistance material VR not including the impurity, a crystallization temperature of the variable resistance material VR including the impurity may be higher than that of the variable resistance material VR not including the impurity. In an implementation, the atomic concentration 'p' of the impurity may be greater than 0 and may be equal to or less than 0.1. If the atomic concentration 'p' of the impurity were to be greater than 0.1, reliability of the variable resistance material VR including germanium (Ge), antimony (Sb) and tellurium (Te) could be deteriorated.

A material A and a material B may be provided. The material A is the variable resistance material VR not including the impurity. The material B is the variable resistance material VR including nitrogen (i.e., the impurity) having an atomic concentration of 6% (i.e., p=0.06).

Phase-change temperatures of the material A and the material B may be increased as the atomic concentration of germanium (Ge) increases. Crystallization temperatures according to the atomic concentrations of germanium (Ge) in the material A and the material B may be different from each other. For example, when the atomic concentration of germanium (Ge) in the material A is equal to or greater than 40% and is equal to or less than 50% (i.e., $0.4\leq x\leq0.5$), the crystallization temperature of the material A may be lower than a soldering temperature. In an implementation, when the atomic concentration of germanium (Ge) in the material A is equal to or greater than 40% and is equal to or less than 50%, the crystallization temperature of the material A may be equal to or greater than 200° C. and may be equal to or less than 250° C. On the contrary, when the atomic concentration of germanium in the material B is equal to or greater than 40% and is equal to or less than 50%, the crystallization temperature of the material B may be higher than the soldering temperature. The soldering temperature may be defined as the highest temperature which may occur in a packaging process for manufacturing the variable resistance memory device. In an implementation, the soldering temperature may be 250° C. or more. In an implementation, when the atomic concentration of germanium (Ge) in the material A is greater than 50% (i.e., $0.5<x$), the crystallization temperature of the material A may be higher than the soldering temperature. Likewise, when the atomic concentration of germanium in the material B is greater than 50%, the crystallization temperature of the material B may be higher than the soldering temperature. In an implementation, when the atomic concentration of germanium in the material B is greater than 40%, the crystallization temperature of the material B may be 260° C. or more. If the crystallization temperature were to be lower than the soldering temperature, write operating characteristics could be deteriorated in the packaging process or high-temperature environment. In an implementation, if the crystallization temperature were to be lower than the soldering temperature, a set operation (i.e., an operation of changing a phase of the variable resistance material VR from an amorphous phase into a crystalline phase) could be performed by the packaging process even though a set operation bias voltage is not applied. Accordingly, initial data stored in a variable resistance memory cell may not be retained. In an implementation, if the crystallization temperature were to be lower than the soldering temperature, the set operation could be performed by the high-temperature environment even though the set operation bias voltage is not applied. Thus, when the crystallization temperature is higher than the soldering temperature, thermal stability and set operating characteristics of the variable resistance memory device may be improved. As a result, the material A may have the improved thermal stability and set operating characteristics when the atomic concentration 'x' of germanium is 0.5 or more. The material B may have the improved thermal stability and set operating characteristics when the atomic concentration 'x' of germanium is 0.4 or more.

Figure 7:
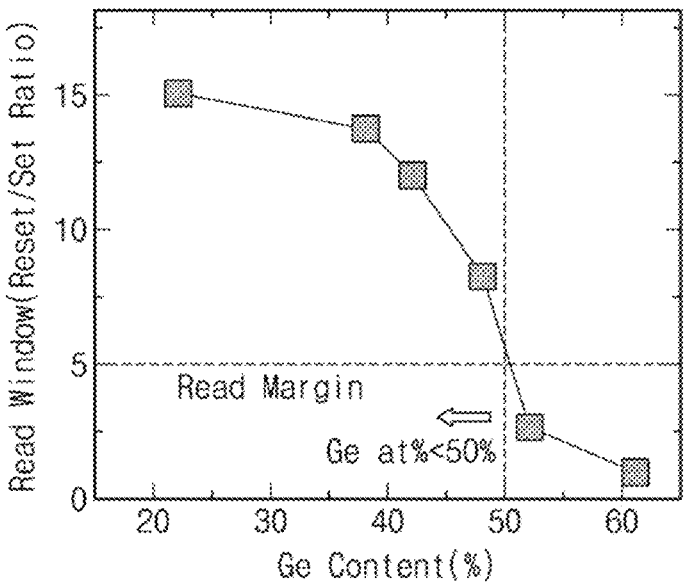
FIG. 7 is a graph showing a read window of a variable resistance material according to an atomic concentration of germanium (Ge).

FIG. 7 is a graph showing a read window of the variable resistance material VR according to an atomic concentration of germanium (Ge). Hereinafter, a maximum atomic concentration of germanium (Ge) in the variable resistance material VR with improved read operating characteristics will be described with reference to FIG. 7. The variable resistance material VR of FIG. 7 may be the material A or the material B of FIG. 6.

Referring to FIG. 7, a read window may be decreased as the atomic concentration of germanium (Ge) in the variable resistance material increases. The read window may be defined as a value obtained by dividing a reset resistance of the variable resistance material VR in a reset state by a set resistance of the variable resistance material VR in a set state. The reset and set resistance values may be more easily distinguished from each other as the read window increases, and thus the variable resistance material VR may have excellent reliability. In an implementation, when the atomic concentration 'x' of germanium (Ge) in the variable resistance material VR is greater than 50% (i.e., 0.5<x), the read window of the variable resistance material VR may be less than a read margin. The read margin may be defined as a value of a minimum read window required to drive the variable resistance memory device. In an implementation, the value of the read margin may be 5.

When the variable resistance material VR has the read window greater than the read margin, the reset and set states may be easily distinguished from each other. Thus, read operating characteristics of the variable resistance memory device may be excellent. In an implementation, when the read margin is 5, the read window of the variable resistance material VR including germanium (Ge) having an atomic concentration of 50% or less may be greater than 5. As a result, the variable resistance material VR including germanium (Ge) having the atomic concentration of 50% or less may have excellent read operating characteristics.

Referring to FIGS. 6 and 7, e.g., when the atomic concentration 'x' of germanium (Ge) in the material A is 0.4≤x≤0.5, the read operating characteristics of the variable resistance memory device including the material A may be improved, but the thermal stability and set operating characteristics of the variable resistance memory device may be deteriorated. On the other hand, when the atomic concentration 'x' of germanium (Ge) in the material B is 0.4≤x≤0.5, the thermal stability, set operating characteristics, and read operating characteristics of the variable resistance memory device including the material B may be improved together. In other words, when the variable resistance material VR in the first composition region P1 of FIG. 5 includes a small amount of the impurity (e.g., the atomic concentration 'p' of the impurity is greater than 0 and is equal to or less than 0.1), the variable resistance memory device including the variable resistance material VR in which the atomic concentration 'x' of germanium (Ge) is 0.4≤x≤0.5 may have the improved thermal stability, set operating characteristics and read operating characteristics.

Figure 8:
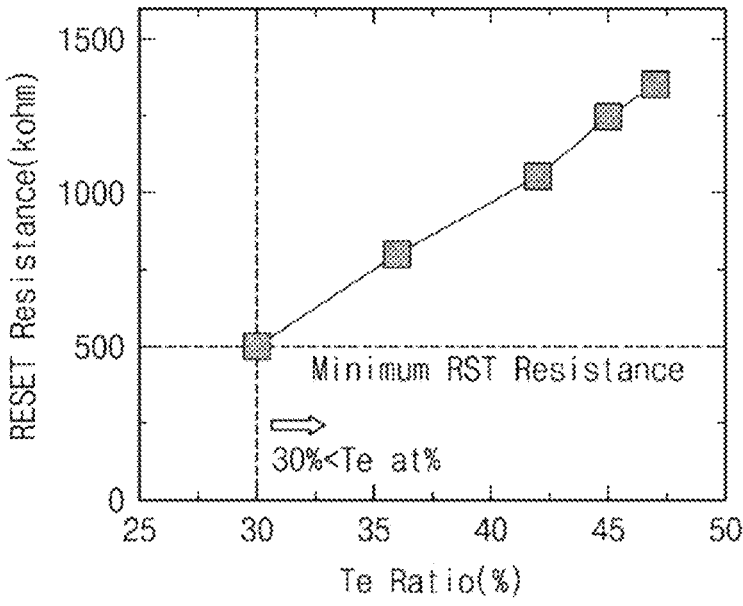
FIG. 8 is a graph showing a reset resistance of a variable resistance material according to an atomic concentration of tellurium (Te).

FIG. 8 is a graph showing a reset resistance of the variable resistance material VR according to an atomic concentration of tellurium (Te). Hereinafter, a minimum atomic concentration of tellurium (Te) in the variable resistance material VR, for performing a read operation, will be described with reference to FIG. 8. The variable resistance material VR of FIG. 8 may be the material A or the material B of FIG. 6.

Referring to FIG. 8, a reset resistance may be increased as the atomic concentration of tellurium (Te) in the variable resistance material VR increases. Thus, the read window may be increased as the atomic concentration of tellurium (Te) in the variable resistance material VR increases. In an implementation, when the atomic concentration of tellurium (Te) in the variable resistance material VR is 30% or more (i.e., the atomic concentration 'z' is 0.3 or more), the reset resistance of the variable resistance material VR may be 500 kilohm or more. When the reset resistance of the variable resistance material VR is 500 kilohm or more, the reset resistance may be five or more times the set resistance. As a result, the read window of the variable resistance material VR including tellurium (Te) having the atomic concentration of 30% or more may be greater than the read margin of 5. Alternatively, when the atomic concentration of tellurium (Te) in the variable resistance material VR is less than 30% (i.e., the atomic concentration 'z' is less than 0.3), the reset resistance of the variable resistance material VR may be less than 500 kilohm. If the reset resistance of the variable resistance material VR were to be less than 500 kilohm, the reset resistance could be less than five times the set resistance. Thus, the read window of the variable resistance material VR could be less than the read margin of 5. As a result, when the atomic concentration 'z' of tellurium (Te) in the variable resistance material VR is 0.3 or more, the read operation of the variable resistance memory device may be normally performed. On the contrary, the read operation of the variable resistance memory device including the variable resistance material VR including tellurium (Te) having the atomic concentration 'z' less than 0.3 may not be normally performed. In other words, the variable resistance memory device including the variable resistance material VR in the first composition region P1 of FIG. 5 may have the normal read operating characteristics.

Referring to FIGS. 6, 7 and 8, the variable resistance memory device including the variable resistance material VR in the first composition region P1 may have improved thermal stability, set operating characteristics, and read operating characteristics. In addition, the variable resistance memory device in the first composition region P1 may have the normal read operating characteristics. Thus, the variable resistance memory device including the variable resistance material VR having the composition according to the embodiments may have improved thermal stability, set operating characteristics, and read operating characteristics.

Figure 9:
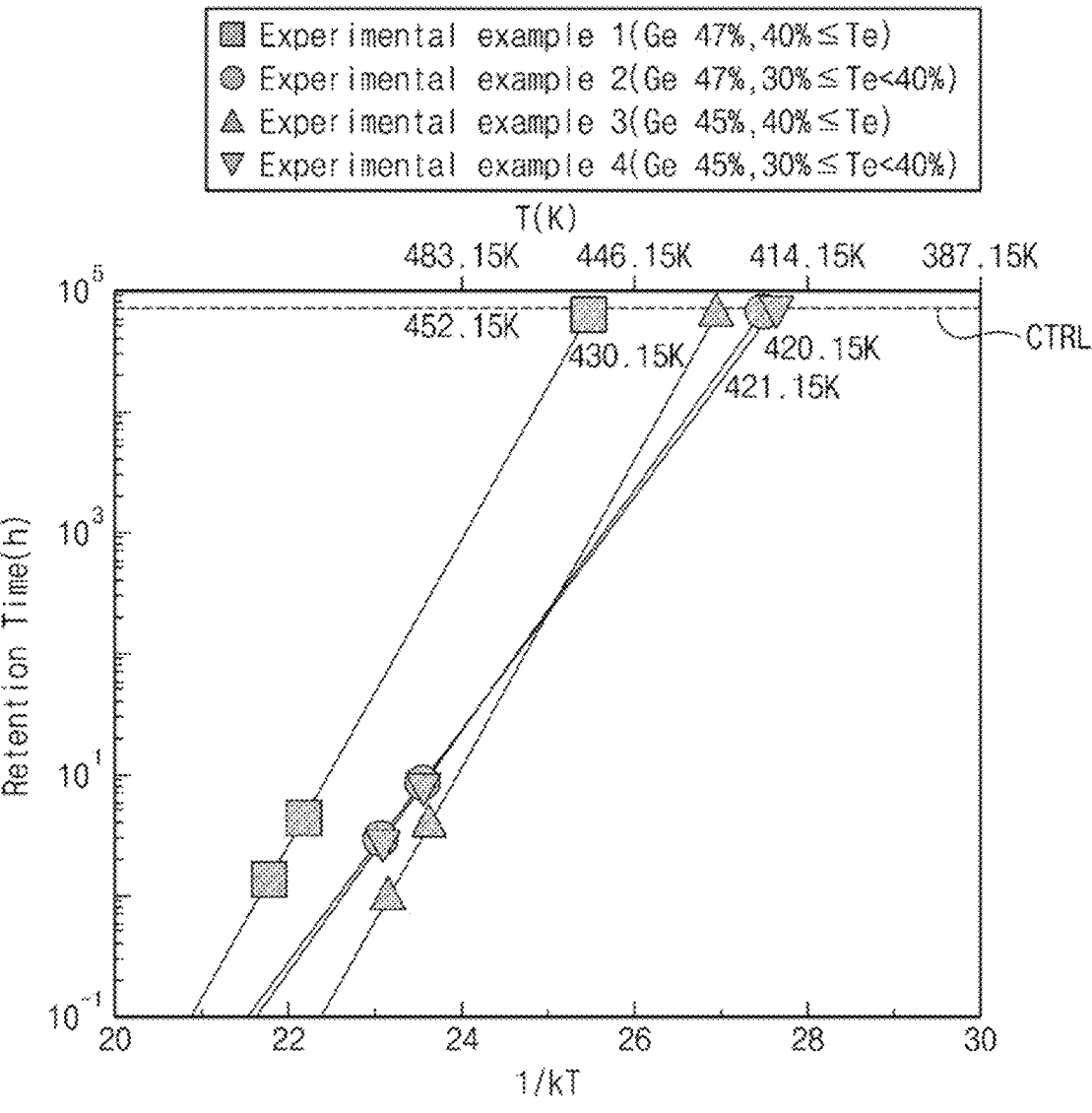
FIG. 9 is a graph showing a retention temperature of a variable resistance material according to some embodiments.

FIG. 9 is a graph showing a retention temperature of the variable resistance material VR according to some embodiments.

Even when the set operation bias voltage is not applied, the variable resistance material VR could be crystallized from an amorphous state to a crystalline state over time. The state of the variable resistance material VR may be changed, and data of the variable resistance memory device could be lost. As the time for the crystallization increases, retention of the variable resistance memory device may be improved. The time for the crystallization may be changed depending on a temperature of the variable resistance material VR. In the present specification, a retention temperature may be defined as a temperature when the time for the crystallization (i.e., a data retention time) is 10 years. As the retention temperature increases, thermal stability of the variable resistance memory device may be improved.

Referring to FIG. 9, x-axes of FIG. 9 show a temperature T and 1/kT, 'T' is an absolute temperature, and 'k' is the Boltzmann constant. The unit of the absolute temperature is K, and the unit of a Celsius temperature is ° C. A y-axis of FIG. 9 shows a retention time. A crystallization time line CRTL of the y-axis of FIG. 9 shows 10 years. Temperatures shown on the crystallization time line CRTL of FIG. 9 are retention temperatures of Experimental examples 1 to 4, respectively. As the retention temperature shown on the crystallization time line CRTL increased, thermal stability of the variable resistance memory device was improved.

Referring to FIG. 9, each of the Experimental examples 1, 2, 3 and 4 had the composition in the first composition region P1 of FIG. 5 according to the embodiments. In an implementation, the variable resistance material VR of each of the Experimental examples 1, 2, 3 and 4 included germanium (Ge), antimony (Sb), tellurium (Te), and an impurity (A). In the variable resistance material VR of the Experimental example 1, the atomic concentration 'x' of germanium was 0.47, the atomic concentration 'z' of tellurium was 0.4≤z, the atomic concentration 'p' of the impurity was 0<p≤0.1, and the atomic concentration 'y' of antimony was greater than 0 and was 1-x-y-p. In the variable resistance material VR of the Experimental example 2, the atomic concentration 'x' of germanium was 0.47, the atomic concentration 'z' of tellurium was 0.3≤z<0.4, the atomic concentration 'p' of the impurity was 0<p≤0.1, and the atomic concentration 'y' of antimony was greater than 0 and was 1-x-y-p. In the variable resistance material VR of the Experimental example 3, the atomic concentration 'x' of germanium was 0.45, the atomic concentration 'z' of tellurium was 0.4≤z, the atomic concentration 'p' of the impurity was 0<p≤0.1, and the atomic concentration 'y' of antimony was greater than 0 and was 1-x-y-p. In the variable resistance material VR of the Experimental example 4, the atomic concentration 'x' of germanium was 0.45, the atomic concentration 'z' of tellurium was 0.3≤z<0.4, the atomic concentration 'p' of the impurity was 0<p≤0.1, and the atomic concentration 'y' of antimony was greater than 0 and was 1-x-y-p.

Referring to FIG. 9, the retention temperature of each of the Experimental examples 1, 2, 3 and 4 was 420.15 K or more (i.e., 147° C. or more) and 452.15 K or less (i.e., 179° C. or less). The retention temperature of the Experimental example 1 was 452.15 K (i.e., 179° C.). The retention temperature of the Experimental example 2 was 421.15 K (i.e., 148° C.). The retention temperature of the Experimental example 3 was 430.15 K (i.e., 157° C.). The retention temperature of the Experimental example 4 was 420.15 K (i.e., 147° C.).

A variable resistance memory device of which the retention temperature is 420.15 K or more (i.e., 147° C. or more) may retain data for 10 years in an environment in which a peripheral temperature is much higher than a room temperature. In an implementation, the variable resistance memory device of which the retention temperature is 420.15 K or more (i.e., 147° C. or more) may be applied to a semiconductor device to be operated in an environment in which a peripheral temperature is much higher than the room temperature. In an implementation, in an environment in which a peripheral temperature is 420.15K (i.e., 147° C.), the variable resistance memory devices according to the Experimental examples 1, 2, 3 and 4 of which the retention temperatures were 420.15 K or more (i.e., 147° C. or more) may be normally operated for 10 years. Thus, the variable resistance memory device having the composition of the variable resistance material VR according to an embodiment may have improved thermal stability.

In an implementation, the variable resistance material VR in the variable resistance memory device may include germanium (Ge), antimony (Sb), tellurium (Te), and an impurity (A). In the composition of the variable resistance material VR, the atomic concentration 'x' of germanium may be 0.4≤x≤0.5, the atomic concentration 'z' of tellurium may be 0.3≤z<0.6, the atomic concentration 'p' of the impurity may be 0<p≤0.1, and the atomic concentration 'y' of antimony may be greater than 0 and may be 1-x-z-p. The composition may be represented as $A_pGe_xSb_yTe_z$. The impurity may include carbon (C) or nitrogen (N). The retention temperature, the thermal stability, the set operating characteristics, and the read operating characteristics of the variable resistance memory device may be improved together in the composition range of the GST and the impurity according to an embodiment.

By way of summation and review, the phase-change memory (PRAM) device may include a phase-change material in an element. The phase-change material may exist in a crystalline or amorphous state in an element, and a phase of the phase-change material may be controlled by controlling a magnitude and a supply time of a current provided through a bit line. An electrical resistance of the phase-change material in the crystalline state may be smaller than an electrical resistance of the phase-change material in the amorphous state.

The variable resistance material and the variable resistance memory device including the same in the embodiments may help improve the thermal stability and the operating characteristics by appropriately designing the composition ratio of the variable resistance material.

One or more embodiments may provide a variable resistance material with thermal stability and operating characteristics improved by designing a composition ratio of the variable resistance material.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a first electrode;
a variable resistance material on the first electrode; and
a second electrode on the variable resistance material,
wherein:
    the variable resistance material includes germanium (Ge), antimony (Sb), tellurium (Te), and at least one impurity (A) and is represented as $A_pGe_xSb_yTe_z$,
    an atomic concentration 'x' of the germanium is $0.4 \leq x \leq 0.5$,
    an atomic concentration 'z' of the tellurium is $0.3 \leq z \leq 0.6$,
    an atomic concentration 'p' of the impurity is $0 < p \leq 0.1$, and
    an atomic concentration 'y' of the antimony is $1-x-z-p$ and is greater than 0.

2. The variable resistance memory device as claimed in claim 1, further comprising a first barrier pattern on the variable resistance material,
    wherein the first barrier pattern is between the variable resistance material and the second electrode.

3. The variable resistance memory device as claimed in claim 1, further comprising:
    a selection element between the first electrode and the variable resistance material; and
    a third electrode between the selection element and the variable resistance material.

4. The variable resistance memory device as claimed in claim 3, further comprising:
    a first barrier pattern between the variable resistance material and the second electrode; and
    a second barrier pattern between the third electrode and the variable resistance material.

5. The variable resistance memory device as claimed in claim 1, wherein the impurity includes at least one of carbon (C) and nitrogen (N).

6. The variable resistance memory device as claimed in claim 1, wherein the atomic concentration 'p' of the impurity is $0.06 \leq p \leq 0.1$.

7. The variable resistance memory device as claimed in claim 1, wherein:
    the atomic concentration 'x' of the germanium is $0.45 \leq x \leq 0.47$, and
    the atomic concentration 'z' of the tellurium is $0.3 \leq z < 0.55$.

8. The variable resistance memory device as claimed in claim 1, wherein an atomic concentration ratio of the germanium (Ge):the antimony (Sb):the tellurium (Te) is 4:1:4.

9. The variable resistance memory device as claimed in claim 1, wherein an atomic concentration ratio of the germanium (Ge):the antimony (Sb):the tellurium (Te) is 4:2:3.

10. The variable resistance memory device as claimed in claim 1, wherein:

the atomic concentration 'y' of the antimony is $0.1 \leq y \leq 0.2$, and
    the atomic concentration 'z' of the tellurium is $0.3 \leq z < 0.5$.

11. The variable resistance memory device as claimed in claim 1, wherein a crystallization temperature of the variable resistance material is higher than a soldering temperature.

12. The variable resistance memory device as claimed in claim 1, wherein a crystallization temperature of the variable resistance material is equal to or higher than 260° C. and equal to or less than 500° C.

13. The variable resistance memory device as claimed in claim 1, wherein a set speed of the variable resistance memory device is 400 ns or less.

14. The variable resistance memory device as claimed in claim 1, wherein a reset resistance of the variable resistance material is equal to or higher than 500 kilohm and equal to or less than 2000 kilohm.

15. The variable resistance memory device as claimed in claim 1, wherein a reset resistance of the variable resistance material is five or more times a set resistance of the variable resistance material.

16. The variable resistance memory device as claimed in claim 1, wherein a retention temperature of the variable resistance material is 179° C. or less.

17. A variable resistance material comprising:
germanium (Ge);
antimony (Sb);
tellurium (Te); and
at least one impurity (A),
wherein:
    the variable resistance material is represented as $A_pGe_xSb_yTe_z$,
    an atomic concentration 'x' of the germanium is $0.4 \leq x \leq 0.5$,
    an atomic concentration 'z' of the tellurium is $0.3 \leq z < 0.6$,
    an atomic concentration 'p' of the impurity (A) is $0 < p \leq 0.1$, and
    an atomic concentration 'y' of the antimony is $1-x-z-p$ and is greater than 0.

18. The variable resistance material as claimed in claim 17, wherein the impurity includes at least one of carbon (C) and nitrogen (N).

19. The variable resistance material as claimed in claim 17, wherein:
    the atomic concentration 'x' of the germanium is $0.45 \leq x \leq 0.47$, and
    the atomic concentration 'z' of the tellurium is $0.3 \leq z < 0.55$.

20. The variable resistance material as claimed in claim 17, wherein:
    the atomic concentration 'y' of the antimony is $0.1 \leq y \leq 0.2$, and
    the atomic concentration 'z' of the tellurium is $0.3 \leq z < 0.5$.

* * * * *